United States Patent
Ichikawa et al.

(10) Patent No.: US 7,683,954 B2
(45) Date of Patent: Mar. 23, 2010

(54) SOLID-STATE IMAGE SENSOR

(75) Inventors: Michinori Ichikawa, Tokyo (JP);
Takanori Tanite, Tokyo (JP); Tadashi Kawata, Tokyo (JP)

(73) Assignees: Brainvision Inc., Tokyo (JP); Stanley Electric Co., Ltd., Tokyo (JP)

( * ) Notice: Subject to any disclaimer, the term of this patent is extended or adjusted under 35 U.S.C. 154(b) by 320 days.

(21) Appl. No.: 11/905,133

(22) Filed: Sep. 27, 2007

(65) Prior Publication Data

US 2008/0079833 A1 Apr. 3, 2008

(30) Foreign Application Priority Data

Sep. 29, 2006 (JP) .............................. 2006-268324

(51) Int. Cl.
  *H01L 27/00* (2006.01)
  *H04N 3/14* (2006.01)
(52) U.S. Cl. ...................... 348/308; 348/294; 356/4.01; 356/5.01; 257/431; 250/208.1
(58) Field of Classification Search ................ 348/294, 348/295, 297, 300–302, 307, 308; 356/4.01, 356/5.01; 257/431; 250/208.1
See application file for complete search history.

(56) References Cited

U.S. PATENT DOCUMENTS

| 7,170,041 | B2 * | 1/2007 | Rahn | 250/208.1 |
| 7,235,772 | B2 * | 6/2007 | Ko et al. | 250/208.1 |
| 2004/0021057 | A1 * | 2/2004 | Drowley | 250/208.1 |
| 2004/0189846 | A1 * | 9/2004 | Hiyama et al. | 348/308 |

FOREIGN PATENT DOCUMENTS

| JP | 2000165754 A | * | 6/2000 |
| JP | 2001-281336 A | | 10/2001 |
| JP | 2003-51988 A | | 2/2003 |
| JP | 2004-294420 A | | 10/2004 |
| JP | 2005-235893 A | | 9/2005 |
| WO | WO 2004070313 A1 | * | 8/2004 |

* cited by examiner

*Primary Examiner*—David L Ometz
*Assistant Examiner*—Dwight Alex C Tejano
(74) *Attorney, Agent, or Firm*—Birch, Stewart, Kolasch & Birch, LLP

(57) ABSTRACT

A solid-state image sensor of a charge sorting method used in a time-of-flight measurement method, in which noise derived from background light, which is caused by the reflection light from the subject derived from background light is eliminated, reflection light from the subject derived from a predetermined light source, which is previously set in the solid-state image sensor, is effectively extracted as a signal component to achieve high sensitivity and low noise, which is a solid-state image sensor that is equipped with a plurality of charge-storage sections, discriminates photoelectrons generated by incoming light on the incoming timing and sort to the above-described plurality of charge-storage sections, and measures the timing of the incoming light, in which the sensor has: a plurality of capacitors that capable of conducting to the plurality of charge-storage sections; and a control section that controls a conducted state between the above-described plurality of charge-storage sections and the above-described plurality of capacitors, in which by selectively conducting the above-described plurality of charge-storage sections and the above-described plurality of capacitors by the control of the above-described control section, the difference component of charge stored in the above-described plurality of charge-storage sections is extracted.

6 Claims, 15 Drawing Sheets

BASIC CIRCUIT OF THE PRESENT INVENTION

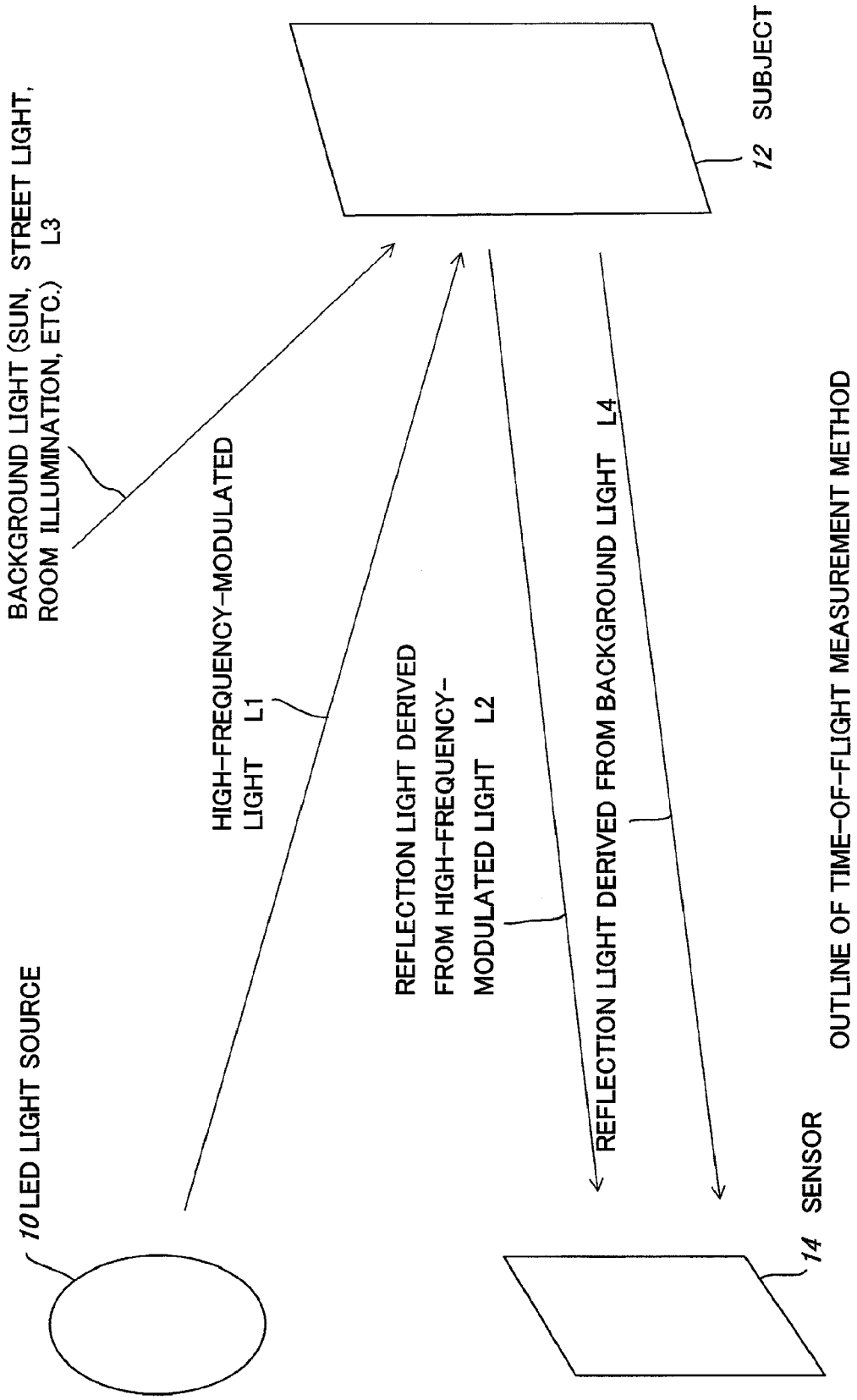

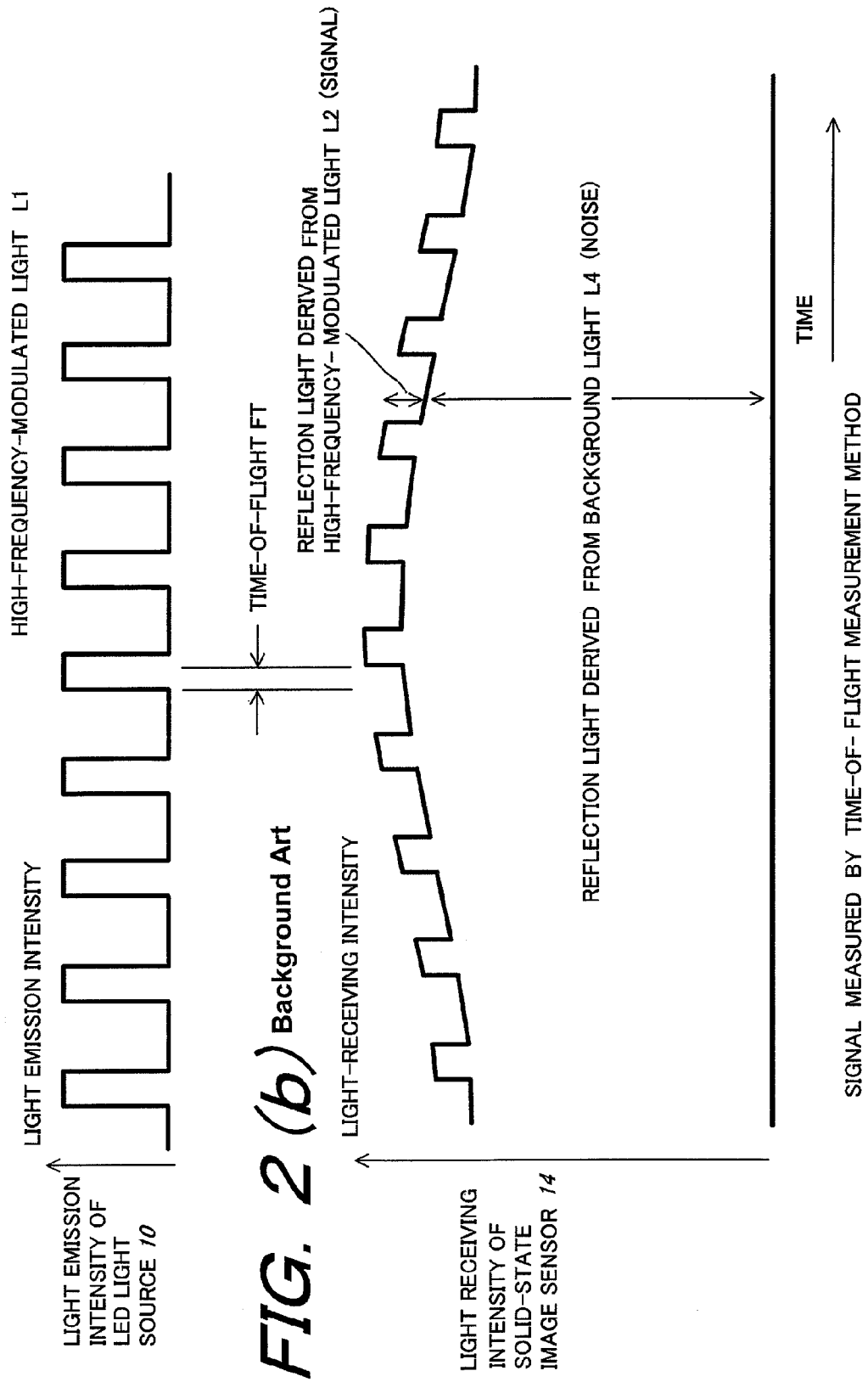

FIG. 3(a)
Background Art
CIRCUIT DIAGRAM
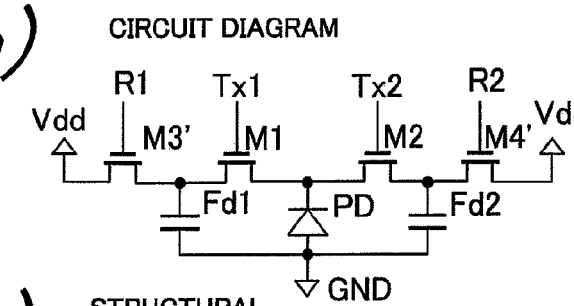
FIG. 3(b)
Background Art
STRUCTURAL VIEW
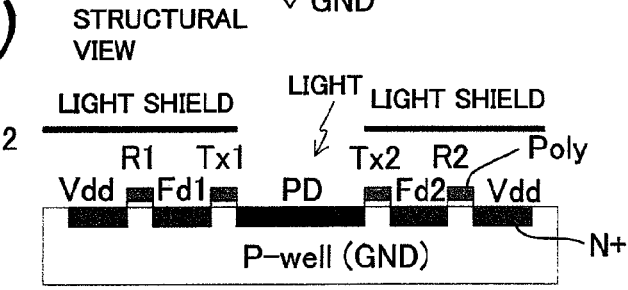
FIG. 3(c)
Background Art
POTENTIAL DIAGRAM
(c-1) INITIAL STATE
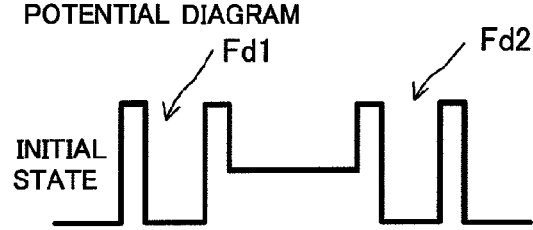
(c-2) LIGHT RECEIVING Tx1 IS ON.
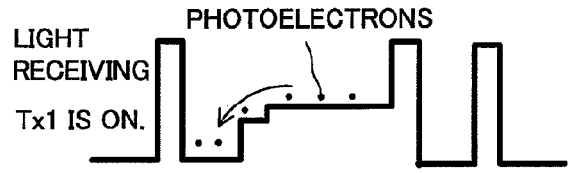
(c-3) LIGHT RECEIVING Tx2 IS ON.
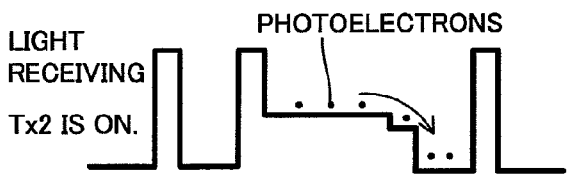
(c-4) CHARGE STORING
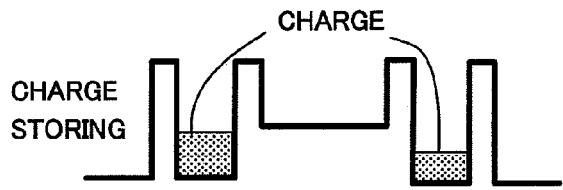
(c-5) RESET
OPERATION EXPLANATORY VIEW OF LIGHT-RECEIVING PORTION

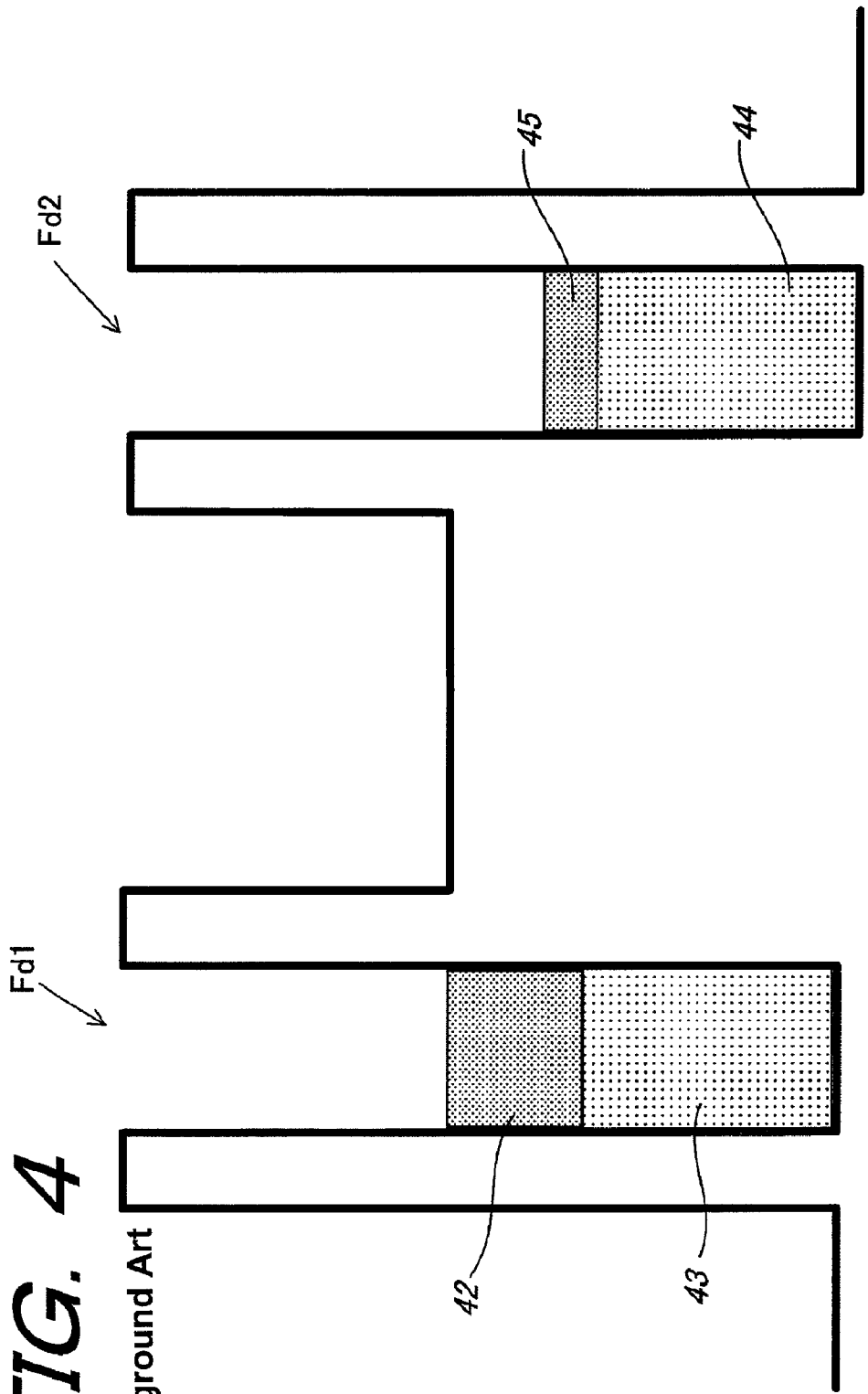

EXPLANATION OF OPERATION PRINCIPLE

EXAMPLE OF THE PRESENT INVENTION EQUIPPED WITH FOUR FD

LAYOUT DESIGN OF EXAMPLE

SOLID-STATE IMAGE SENSOR

BACKGROUND OF THE INVENTION

1. Field of the Invention

The present invention relates to a solid-state image sensor, more particularly to the improvement of a solid-state image sensor that can be utilized as each pixel of a time-of-flight distance sensor that measures time-of-flight by receiving the reflection light of light irradiated on a subject using a time-of-flight measurement method (TOF: Time of flight) to measure a distance to the subject based on the time-of-flight, an image sensor that obtains the three-dimensional image of the subject, or the like, and the invention particularly relates to a solid-state image sensor in which the method of difference extraction of sorted charge in a solid-state image sensor employing a charge sorting method that can be used under unknown background light illumination.

2. Description of the Related Art

As a solid-state image sensor that can be used as a conventional time-of-flight sensor using the time-of-flight measurement method, there is known a distance image imaging device disclosed in Japanese Patent Laid-open No. 2001-281336 publication, a solid-state image sensor disclosed in Japanese Patent Laid-open No. 2003-51988 publication, a range image sensor disclosed in Japanese Patent Laid-open No. 2004-294420 publication, a time-of-flight distance sensor disclosed in Japanese Patent Laid-open No. 2005-235893 publication or the like, for example.

Herein, FIG. 1 shows an explanatory view for describing the principle of the time-of-flight measurement method. In FIG. 1, reference numeral 10 denotes an LED light source, reference numeral 12 denotes a subject on which light associated with the light emission of the LED light source 10 is irradiated, reference numeral 14 denotes a sensor where a solid-state image sensor receiving reflection light from the subject 12 is used as 1 pixel and the sensors are arranged on a two-dimensional plane in an array state.

The time-of-flight measurement method is a method in which light modulated by high frequency, e.g. 10 MHz, (high-frequency-modulated light) L1 is irradiated on the subject 12 as signal light from the LED light source 10, reflection light derived from the LED light source 10 (reflection light derived from high-frequency-modulated light) L2 is captured as a signal by the solid-state image sensors of the sensor 14, and distance from the subject 12 to the sensor 14 and the LED light source 10 is measured from phase shifting between the high-frequency-modulated light L1 and the reflection light derived from high-frequency-modulated light L2.

In such a time-of-flight measurement method, measurement is relatively easy if light that the solid-state image sensors of the sensor 14 receive is only the reflection light derived from high-frequency-modulated light L2 being reflection light derived from the LED light source 10.

However, in actual measurement sites, unknown background light L3 of various factors such as the sun, street light and room illumination exists, reflection light derived from the background light L3 (reflection light derived from background light) L4 becomes noise and received by the solid-state image sensors of the sensor 14.

FIGS. 2(a)(b) respectively show the light emission intensity of the LED light source 10 (FIG. 2(a)) and the light-receiving intensity of solid-state image sensor (FIG. 2(b)) and are timing charts showing their light emission timing and light-receiving timing, there are cases where the reflection light derived from high-frequency-modulated light L2 has extremely smaller light-receiving intensity comparing to the reflection light derived from background light L4 as shown in FIG. 2(b).

Herein, since time-of-flight FT that appears as the phase shifting between the high-frequency-modulated light L1 and the reflection light derived from high-frequency-modulated light L2 is as short as approximately 100 nsec in the distance of approximately 15 m, there has been a problem that accurate measurement could not be performed without sufficient signal-to-noise ratio in the time-of-flight measurement method.

As a method of solving the problem in the time-of-flight measurement method, various structures of a solid-state image sensor as shown in the above-described Japanese Patent Laid-open No. 2001-281336 publication, Japanese Patent Laid-open No. 2003-51988 publication, Japanese Patent Laid-open No. 2004-294420 publication or Japanese Patent Laid-open No. 2005-235893 publication, for example, have been proposed.

Herein, although the solid-state image sensor disclosed in the above-described Japanese Patent Laid-open No. 2001-281336 publication, Japanese Patent Laid-open No. 2003-51988 publication, Japanese Patent Laid-open No. 2004-294420 publication or Japanese Patent Laid-open No. 2005-235893 publication has different methods, they are basically based on a principle that two or more charge storage capacitors are connected to one photodiode, high-frequency-modulated light or pulse-emitted light is separated and stored in the above-described two or more charge storage capacitors synchronizing with its modulation or light emission time, signal-to-noise ratio is increased by reading out and averaging separated/stored charge by each given amount of time, and distance is calculated by using a signal obtained based on the separated/stored charge. It is to be noted that this principle should be appropriately called as a charge sorting method in this specification.

FIGS. 3(a) (b) (c) show an example of a light-receiving portion where charge in a solid-state image sensor is separated and stored according to the above-described charge sorting method of separating and storing charge, where FIG. 3(a) shows a circuit diagram, FIG. 3(b) shows a structural view, and FIG. 3(c) shows a potential diagram.

In FIGS. 3(a) (b), reference numeral PD denotes a photodiode, reference numeral Fd1 denotes a first storage capacitor, reference numeral Fd2 denotes a second storage capacitor, reference numeral M1 denotes a first FET switch, reference numeral M2 denotes a second FET switch, reference numeral M3' denotes a first reset FET, reference numeral M4' denotes a second reset FET, reference numeral Tx1 denotes a first transfer gate driving the first FET switch M1, reference numeral Tx2 denotes a second transfer gate driving the second FET switch M2, reference numeral R1 denotes the gate of the first reset FET M3', reference numeral R2 denotes the gate of the second reset FET M4', and reference numeral Vdd denotes a power source.

In the solid-state image sensor, the first storage capacitor Fd1 and the second storage capacitor Fd2 as a plurality of storage capacitors are connected to one photodiode PD via the first FET switch M1 and the second FET switch M2 respectively.

Therefore, by severally controlling voltage to be applied to the first transfer gate Tx1 driving the first FET switch M1 and the second transfer gate Tx2 driving the second FET switch M2, photoelectrons generated in the photodiode PD can be sorted and stored in the first storage capacitor Fd1 and the second storage capacitor Fd2.

Herein, the first reset FET M3' is used for initializing charge stored in the first storage capacitor Fd1, and the second reset FETM4' is used for initializing charge stored in the second storage capacitor Fd2, and when voltage is applied severally to the gate R1 and the gate R2, the voltage of the storage capacitor Fd1 and the storage capacitor Fd2 is initialized to the voltage of the power source Vdd.

When light is irradiated on the potential in the initial state after the above-described reset (refer to FIG. c-1), photoelectrons are generated in the photodiode PD.

After that, when voltage is applied to the first transfer gate Tx1, the photoelectrons generated in the photodiode PD run down to the first storage capacitor Fd1 side according to the potential (refer to FIG. c-2).

Herein, when the voltage of the first transfer gate Tx1 is returned and voltage is applied to the second transfer gate Tx2 on the contrary, the photoelectrons generated in the photodiode PD run down to the second storage capacitor Fd2 side according to the potential (refer to FIG. c-3).

When the above-described application of voltage to the first transfer gate Tx1 and the second transfer gate Tx2 is repeated at high frequency, each temporarily sorted charge is severally stored in the first storage capacitor Fd1 and the second storage capacitor Fd2 as shown in FIG. c-4.

After the charge stored in the first storage capacitor Fd1 and the second storage capacitor Fd2 are read out in this manner by a read out circuit (not shown), voltage is applied to the first transfer gate Tx1 and the second transfer gate Tx2 to reset (FIG. c-5), and the charge is initialized.

Therefore, according to the solid-state image sensor shown in FIGS. 3(a) (b) (c), by reading out and averaging the charge stored in the first storage capacitor Fd1 and the second storage capacitor Fd2 by each given amount of time, the signal-to-noise ratio is increased and distance can be calculated by using a signal obtained based on the separated/stored charge.

Incidentally, in the case where the solid-state image sensor having the constitution shown in FIGS. 3(a) (b) (c) is used as the solid-state image sensors of the sensor 14 and the light as shown in FIGS. 2(a) (b) is measured in the constitution shown in FIG. 1, charge as shown in FIG. 4, for example, is stored in the first storage capacitor Fd1 and the second storage capacitor Fd2 of the solid-state image sensor after passing the given time.

In this embodiment, the photodiode is expediently shown as PN junction type in the drawings. However, the transfer efficiency and the transfer rate between the photodiode and the transfer gate will be able to be improved by using an implanted photodiode and/or photo gate type detector.

Meanwhile, in FIG. 4, reference numeral 42 expediently denotes a component by the reflection light derived from high-frequency-modulated light L2 synchronized with the first transfer gate Tx1, which is derived from the LED light source 10, reference numeral 45 expediently denotes a component by the reflection light derived from high-frequency-modulated light L2 synchronized with the second transfer gate Tx2, which is derived from the LED light source 10, reference numeral 43 expediently denotes a component by the reflection light derived from background light L4 derived from the background light L3, which is synchronized with the first transfer gate Tx1, and reference numeral 44 expediently denotes a component by the reflection light derived from background light L4 derived from the background light L3, which is synchronized with the second transfer gate Tx2, but actually, the component of reference numeral 42 and the component of reference numeral 43 cannot be separated by each component, and the component of reference numeral 44 and the component of reference numeral 45 cannot be separated by each component as well.

Then, in the case where the contribution of the background light L3 is large in the constitution shown in FIG. 1, there has been a problem that charge severally stored in the first storage capacitor Fd1 and the second storage capacitor Fd2 was saturated as shown in FIG. 5, sorting action of charge became invalid.

Specifically, in FIG. 5, reference numeral 52 and reference numeral 53 severally express saturated charge, and reference numeral 54 express charge overflown from the first storage capacitor Fd1 and the second storage capacitor Fd2.

In this case, charge exceeded a potential difference between the photodiode PD and the first storage capacitor Fd1 controlled by the first transfer gate Tx1, and a potential difference between the photodiode PD and the second storage capacitor Fd2 controlled by the second transfer gate Tx2, and sorting action of charge became invalid.

Conventionally, to avoid malfunction caused by such saturation of charge, device such that near infrared light has been used as the LED light source 10, a bandpass filter having the wavelength of the light has been installed accordingly to the solid-state image sensors of the sensor 14, to attenuate as much reflection light derived from background light L4 derived from the background light L3 as possible.

However, since sunlight contains much near infrared light, it has been difficult to eliminate its influence considering the use in outdoor.

Further, the invention described in the above-described Japanese Patent Laid-open No. 2004-294420 publication discloses a device such that influence of background light is reduced by separately observing background light before the emission of modulated light.

However, to realize an essentially high-sensitivity sensor, a measure for solving such a problem of saturation caused by background light is necessary, because the smaller capacitance of the first storage capacitor Fd1 and the second storage capacitor Fd2 is desirable for higher sensitivity, but in this case, there is a fear that charge amount reaching saturation becomes smaller and the capacitors cannot be used by being saturate by the background light.

OBJECTS AND SUMMARY OF THE INVENTION

The present invention has been created in view of the above-described various problems that conventional art has, and it is an object of the invention to provide a solid-state image sensor of the charge sorting method used in the time-of-flight measurement method, in which noise derived from background light, which is caused by the reflection light from the subject derived from background light is eliminated, reflection light from the subject derived from a predetermined light source, which is previously set in solid-state image sensor, is effectively extracted as a signal component to achieve high sensitivity and low noise.

To achieve the above-described objects, the present invention has been created based on the following findings by the inventor of this application.

Specifically, background light causing the above-described saturation of charge stored in the first storage capacitor Fd1 and the second storage capacitor Fd2 becomes substantially the same amount as the example shown in FIG. 4. Further, as it has been described above referring to FIG. 4, since the component of reference numeral 42 and the component of reference numeral 43 cannot be separated by each component and the component of reference numeral 44 and the component of reference numeral 45 cannot be separated by each component actually, effective information is only the difference of charge severally stored in the first storage capacitor Fd1 and the second storage capacitor Fd2.

Therefore, if only the difference can be extracted and stored, noise derived from background light by the reflection light from the subject derived from background light is eliminated consequently, and only the signal component of reflection light from the subject derived from a predetermined light source, which is previously set in the solid-state image sensor, can be extracted.

Specifically, the present invention is a solid-state image sensor that is equipped with a plurality of charge-storage sections, discriminates photoelectrons generated by incoming light on the incoming timing and sort to the above-described plurality of charge-storage sections, and measures the timing of the incoming light, in which the sensor has: a plurality of capacitors that capable of conducting to a plurality of charge-storage sections; and a control section that controls a conducted state between the above-described plurality of charge-storage sections and the above-described plurality of capacitors, in which by selectively conducting the above-described plurality of charge-storage sections and the above-described plurality of capacitors by the control of the above-described control section, the difference component of charge stored in the above-described plurality of charge-storage sections is extracted.

Further, the present invention is that the electric capacitance values of the above-described plurality of capacitors are equal to each other, and connection switching circuits, each of which is constituted by two FET switches, are provided for the both terminals of the above-described plurality of capacitors as the above-described control section.

Further, the present invention is that one terminal of the above-described FET switch is connected to the above-described plurality of charge-storage sections and the other terminal of the above-described FET switch is connected to bias voltage.

Further, the present invention is that the above-described plurality of charge-storage sections are made up of two charge-storage sections, the above-described plurality of capacitors are made up of two capacitors, and the above-described control section repeats a first connected state where one side of the above-described charge-storage section is connected to one side of the above-described capacitor and the other side of the above-described charge-storage section is connected to the other side of the above-described capacitor and a second connected state where the other side of the above-described charge-storage section is connected to one side of the above-described capacitor and one side of the above-described charge-storage section is connected to the other side of the above-described capacitor, by each given amount of time.

Since the present invention is constituted as described above, it exerts an excellent effect that the solid-state image sensor of the charge sorting method used in the time-of-flight measurement method, where noise derived from background light by the reflection light from the subject derived from background light is eliminated, reflection light from the subject derived from a predetermined light source, which is previously set in the solid-state image sensor, is effectively extracted as a signal component, and high sensitivity and low noise are achieved, can be provided.

The present invention can be utilized for a distance sensor that measures distance to an obstacle by installing on an automobile or the like.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is an explanatory view for describing the principle of a time-of-flight measurement method;

FIG. 2 is a timing chart that shows the light emission intensity of an LED light source (FIG. 2(a)) and the light-receiving intensity of a solid-state image sensor (FIG. 2(b)) as signals measured by the time-of-flight measurement method, and shows each light emission timing and light-receiving timing;

FIG. 3 shows an operation explanatory view by an example of a light-receiving portion where charge is separated and stored in a solid-state image sensor by the charge sorting method where charge is separated and stored, in which FIG. 3(a) shows a circuit diagram, FIG. 3(b) shows a structural view, and FIG. 3(c) shows a potential diagram;

FIG. 4 is an explanatory view showing the appearance of normal charge storage;

DETAILED DESCRIPTION OF THE PREFERRED EMBODIMENTS

Hereinafter, description will be made for an embodiment example of the solid-state image sensor according to the present invention in detail referring to the attached drawings.

Figure 5:
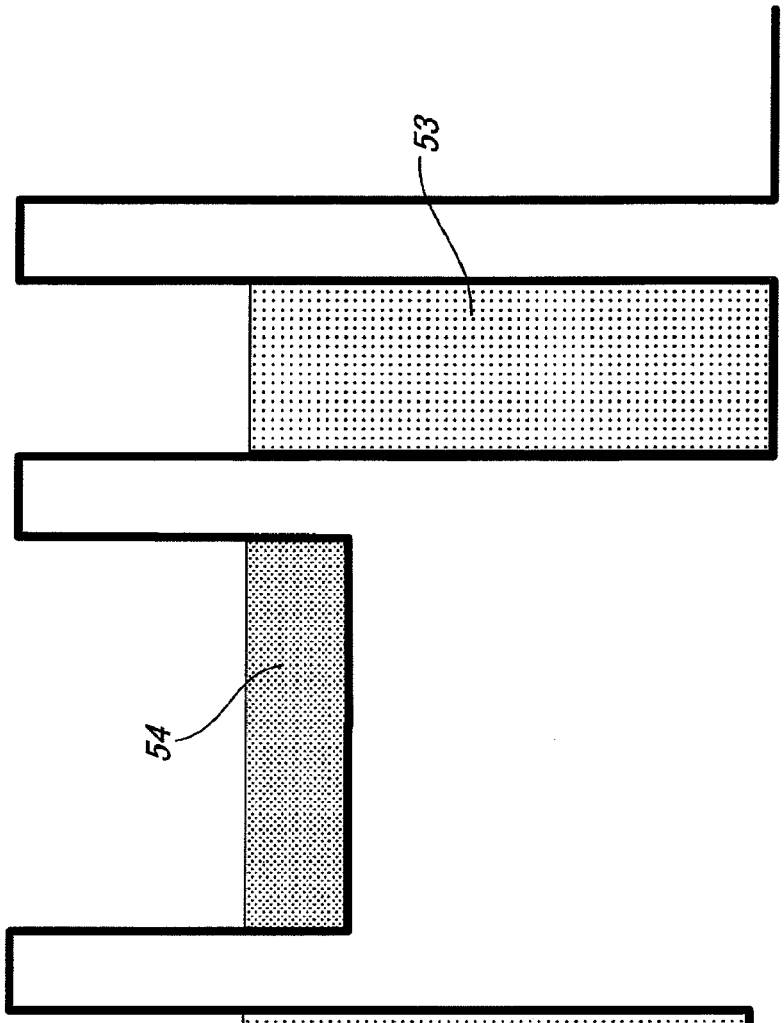
FIG. 5 is an explanatory view showing the appearance of saturated charge storage.
Figure 6:
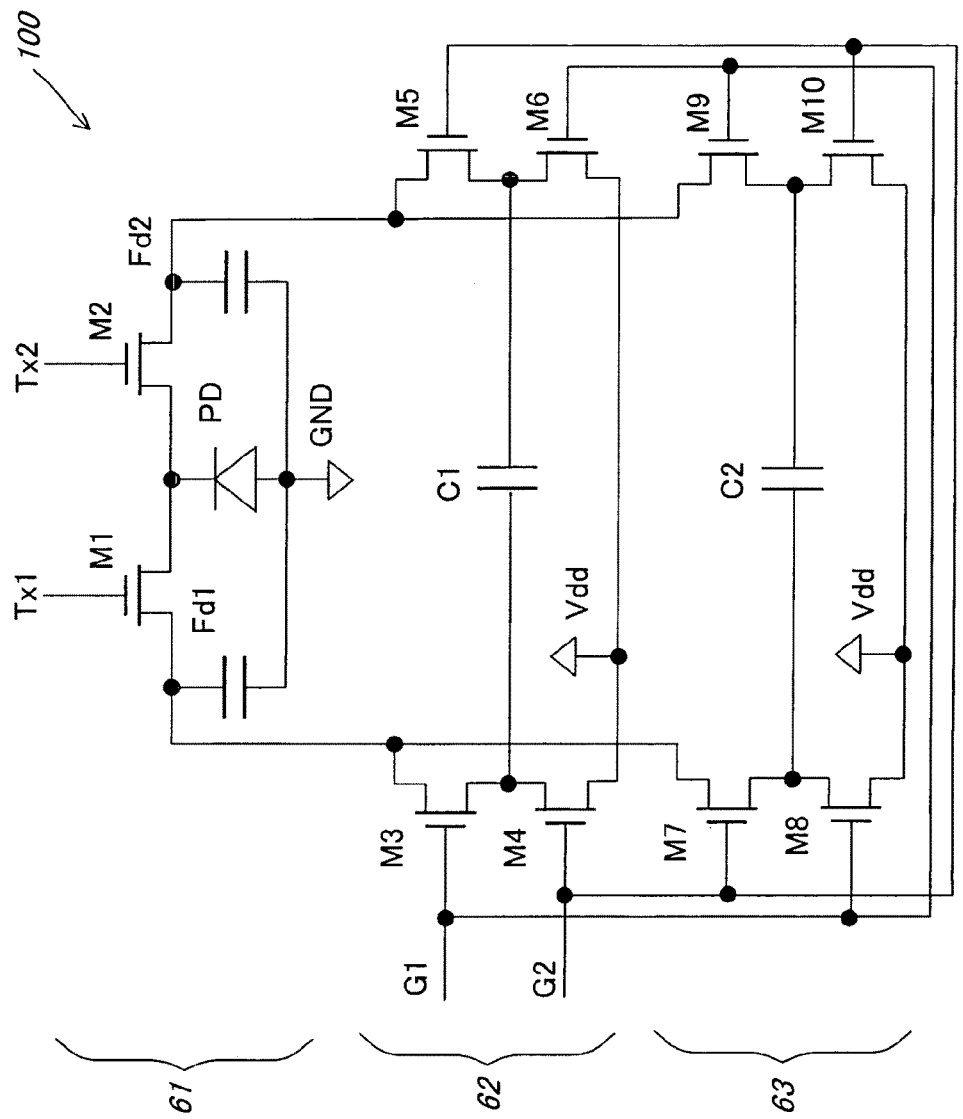
FIG. 6 is circuit diagram of a basic circuit of an embodiment example of the solid-state image sensor according to the present invention.

FIG. 6 shows the circuit diagram of the basic circuit of the embodiment example of the solid-state image sensor according to the present invention.

Meanwhile, in the circuit diagram of FIG. 6, reference numerals same as the reference numerals used in FIG. 3 are attached to constitutions same as or equivalent to the constitutions the conventional circuit diagram shown in FIG. 3, and detailed description of the constitution and function is appropriately omitted.

A solid-state image sensor 100 shown in FIG. 6 is used as the solid-state image sensor of a sensor 14 in the constitution shown in FIG. 1, for example, and for this reason, FIG. 1 is appropriately referred to in the following explanation.

The solid-state image sensor 100 shown in FIG. 6 is constituted by having: a separating/storing section 61 that separates and stores charge of photoelectrons generated through receiving light by a photodiode PD synchronously with the high-frequency-modulated light L1 that is irradiated as signal light from the LED light source 10 to the subject; and a first capacitor connection control section 62 and a second capacitor connection control section 63 which switch the connection of capacitors.

Herein, the separating/storing section 61 provided with a circuit constitution similar to the circuit constitution of the conventional solid-state image sensor shown in FIG. 3.

In this embodiment, the photodiode is expediently shown as PN junction type in the drawings. However, the transfer efficiency and the transfer rate between the photodiode and the transfer gate will be able to be improved by using an implanted photodiode and/or photo gate type detector.

On the other hand, the first capacitor connection control section 62 is constituted by having a first capacitor C1, a third FET switch M3, a fourth FET switch M4, a fifth FET switch M5, a sixth FET switch M6 and a first power source Vdd that applies bias voltage. Further, the second capacitor connection control section 63 is constituted by having a second capacitor C2, a seventh FET switch M7, an eighth FET switch M8, a ninth FET switch M9, a tenth FET switch M10, and a second power source Vdd that applies bias voltage.

The first capacitor C1 of the first capacitor connection control section 62 and the second capacitor C2 of the second capacitor connection control section 63 are severally connected to a first storage capacitor Fd1 and a second storage capacitor Fd2, which are two storage capacitors that exist in the separating/storing section 61 via the first to tenth FET switches (M1 to 10).

At this point, polarity where the first capacitor C1 and the first storage capacitor Fd1 are connected and polarity where the second capacitor C2 and the second storage capacitor Fd2 are connected are inverted, and polarity where the first capacitor C1 and the second storage capacitor Fd2 are connected and polarity where the second capacitor C2 and the first storage capacitor Fd1 are connected are inverted. By such inverted connection of polarity, a part or all of stored charge is neutralized and deleted.

Herein, charge stored in each of the above-described capacitors has a difference, the difference portion is left without being neutralized.

Therefore, when each of the above-described FET switches is switched to repeat inverted connection at a given period, the difference of separated and stored charge is left and accumulated as a result.

However, since the background light is not synchronized with the high-frequency-modulated light L1 that is irradiated as signal light from the LED light source 10 to the subject, it is distributed to the two storage capacitors of the first storage capacitor Fd1 and the second storage capacitor Fd2 substantially equally, and substantially deleted by the switching of inverted connection.

Description will be made for the above-described solid-state image sensor 100 in more details, where the solid-state image sensor 100 is constituted by adding two sets of capacitor connection control sections (the first capacitor connection control section 62 and the second capacitor connection control section 63), each of which is a circuit constituted by having four FET switches and one capacitor, to the separating/storing section 61 being a circuit equal to the basic receiving/storing circuit of the conventional solid-state image sensor shown in FIG. 3.

Specifically, in the first capacitor connection control section 62, the third FET switch M3, the fourth FET switch M4, the fifth FET switch M5 and the sixth FET switch M6 are arranged symmetrically sandwiching the first capacitor C1.

Herein, the third FET switch M3 and the sixth FET switch M6 are driven by same gate signal G1 of the first gate G1, and on the other hand, the fourth FET switch M4 and the fifth FET switch M5 are driven by the same gate signal G2 of the second gate G2.

Similarly, in the second capacitor connection control section 63, the seventh FET switch M7, the eighth FET switch M8, the ninth FET switch M9 and the tenth FET switch M10 are arranged symmetrically sandwiching the second capacitor C2.

Herein, the eighth FET switch M8 and the ninth FET switch M9 are driven by the same gate signal G1 of the first gate G1, and on the other hand, the seventh FET switch M7 and the tenth FET switch M10 are driven by the same gate signal G2 of the second gate G2.

Therefore, both ends of the first capacitor C1 and the second capacitor C2 are selectively connected to the first storage capacitor Fd1, the second storage capacitor Fd2, the first power source Vdd and the second power source Vdd via the third to tenth FET switches (M3 to 10).

It is to be noted that the first storage capacitor Fd1 and the second storage capacitor Fd2 are capacitors formed by impurity diffusion in a semiconductor substrate, for example, and the first capacitor C1 and the second capacitor C2 are capacitors formed between metal wiring layers, for example.

Herein, the electric capacitance values of the first storage capacitor Fd1 and the second storage capacitor Fd2 should be equal, and the electric capacitance values of the first capacitor C1 and the second capacitor C2 should be equal.

It is to be noted that the electric capacitance values of the first storage capacitor Fd1 (the second storage capacitor Fd2) and the first capacitor C1 (the second capacitor C2) should not necessarily be equal but it is preferable to make them equal values.

In the following explanation, to make the present invention be easily understood, each electric capacitance value of the first storage capacitor Fd1, the second storage capacitor Fd2, the first capacitor C1 and the second capacitor C2 should be equal and should be expressed as "C".

Further, the separating/storing section 61 is a circuit that separates and stores charge of photoelectrons generated through receiving light by the photodiode PD synchronously with the high-frequency-modulated light L1 as described above, the first transfer gate Tx1 and the second transfer gate Tx2 are driven by a high-speed signal, and perform the operation of sorting charge to the first storage capacitor Fd1 and the second storage capacitor Fd2.

Figure 7:
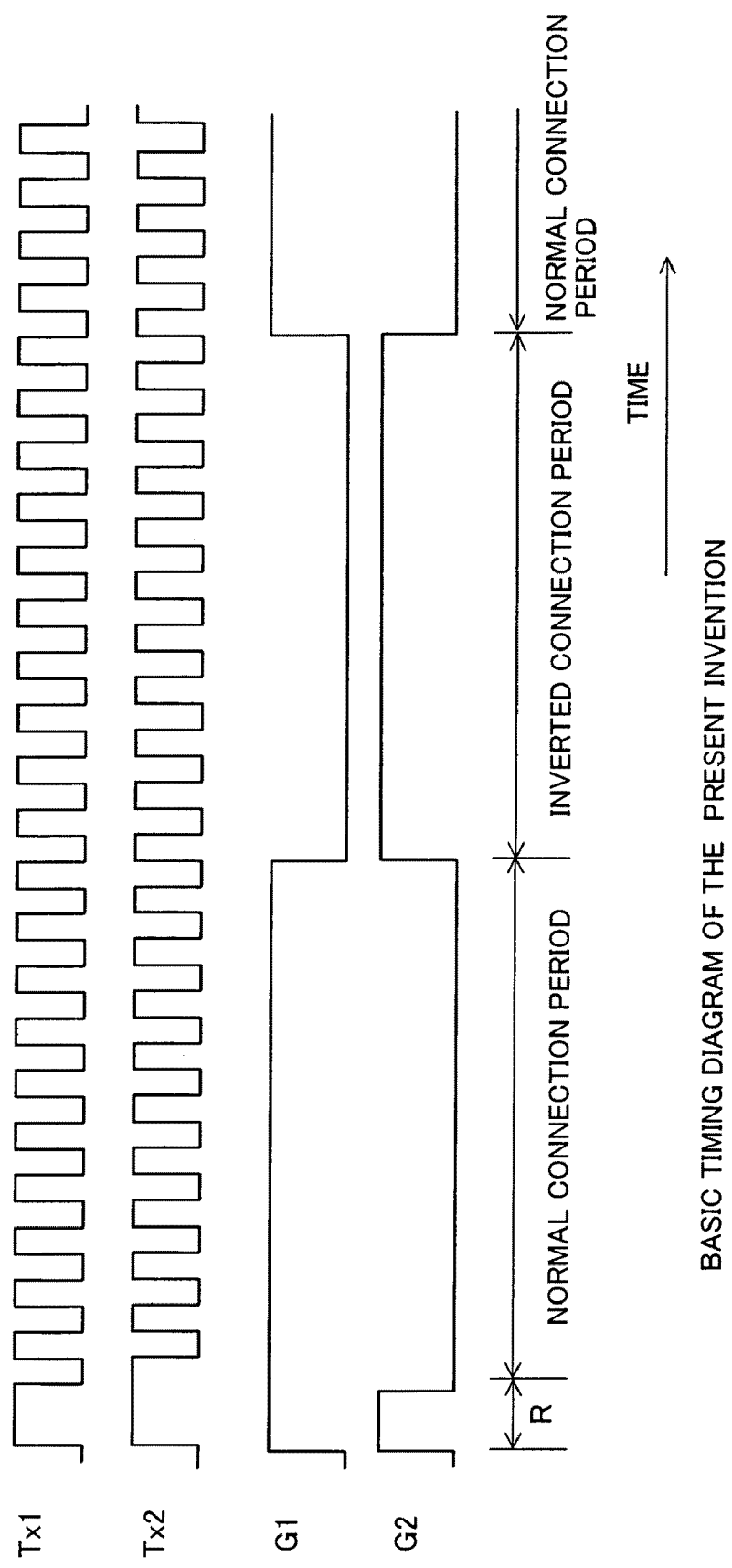
FIG. 7 is a basic timing diagram of the solid-state image sensor according to the present invention, which shows the timing chart of gate voltage applied to the circuit of the solid-state image sensor according to the present invention.

FIG. 7 shows the timing chart of gate voltage applied to the circuit of the above-described solid-state image sensor 100. It is to be noted that, in FIG. 7, time should pass from the left side toward the right side of the drawing.

First, voltage is applied to all gates of the first transfer gate Tx1, the second transfer gate Tx2, the first gate G1 and the second gate G2 first. It is to be noted that time when voltage is applied to all gates first should be called as a reset period R.

Since all of the first to tenth FET switches (M1 to 10) are connected in the reset period R, terminals of the first storage capacitor Fd1 and the second storage capacitor Fd2 become equal to Vdd potential. Further, the potential of the photodiode PD is reset to a potential according to the voltage applied to the first transfer gate Tx1 and the second transfer gate Tx2, and the first capacitor C1 and the second capacitor C2 are reset to a discharged state.

It is to be noted that each of the above-described reset is performed at the beginning of reading out a screen of a line to which each pixel belongs in the case where the solid-state image sensor 100 is used as each pixel of a time-of-flight sensor.

When the above-described reset ends, high-speed drive pulse for sorting and storing the charge of photoelectrons generated through receiving light by the photodiode PD synchronously with the high-frequency-modulated light L1 is applied to the first transfer gate Tx1 and the second transfer gate Tx2 until the next time of reset as shown in FIG. 7. Further, inverted pulse voltage having equal time is alternately applied to the first gate G1 the second gate G2 continuously as shown in FIG. 7.

Herein, a period of time where voltage is applied to the first gate G1 and voltage is not applied to the second gate G2 should be called a normal connection period, and on the contrary, a period of time where voltage is applied to the second gate G2 and voltage is not applied to the first gate G1 should be called an inverted connection period.

Such a normal connection period and inverted connection period are equal time, and should be time having integral multiple of high-speed pulse given to the first transfer gate Tx1 and the second transfer gate Tx2.

Meanwhile, in the example shown in FIG. 7, the number of the normal connection period and the inverted connection period given to the first transfer gate Tx1 and the second transfer gate Tx2 is one set for 20 high-speed pulses expediently, but in actual time-of-flight measurement, it is preferable that the number of the normal connection period and the inverted connection period be about one set for 100 to 1000 high-speed pulses given to the first transfer gate Tx1 and the second transfer gate Tx2, for example.

Figure 8:
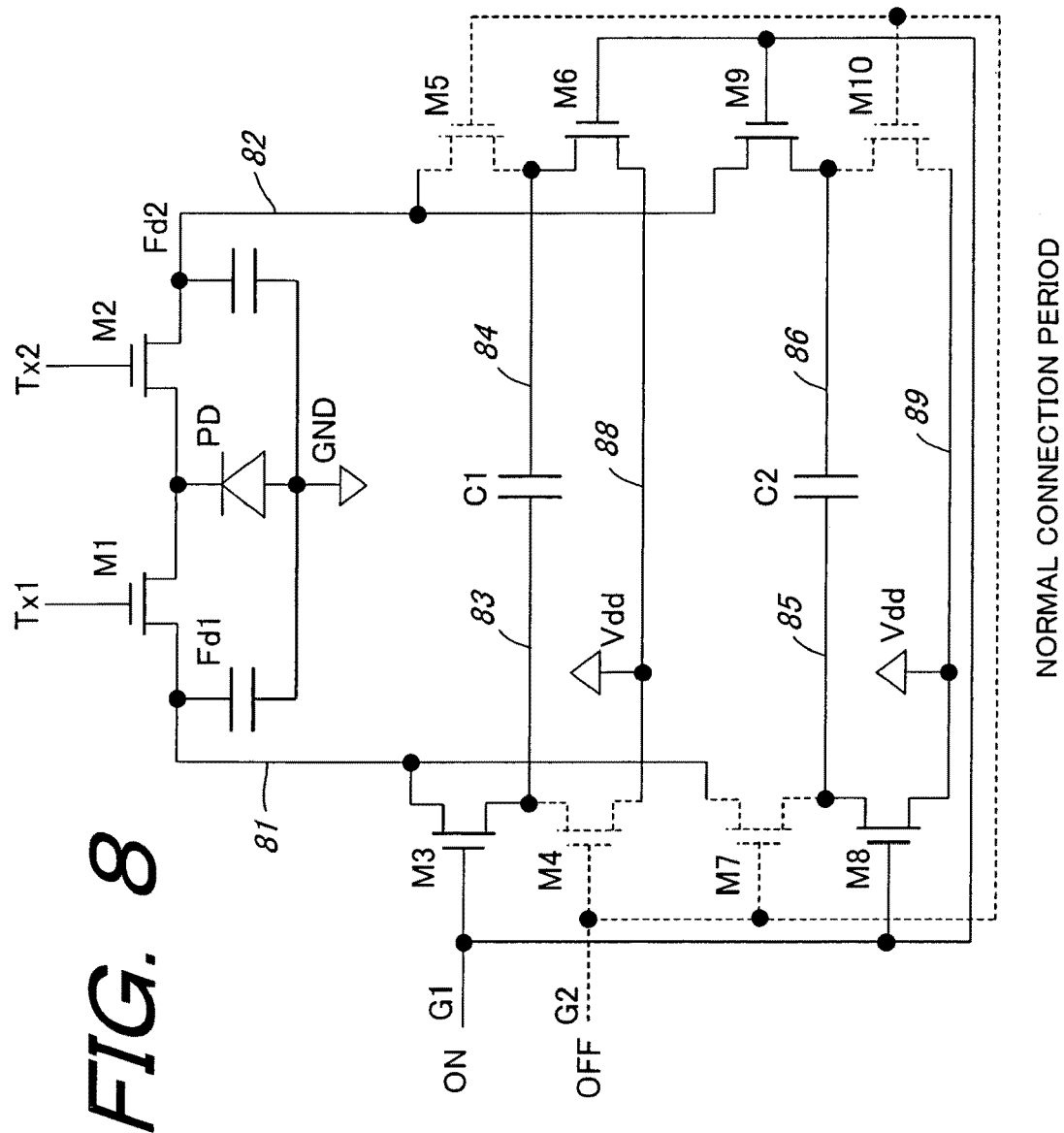
FIG. 8 is a circuit diagram showing the connected state of FET switches in a normal connection period.

As described above, since voltage is applied to the first gate G1 but voltage is not applied to the second gate G2 in the normal connection period, each FET switch of the third FET switch M3, the sixth FET switch M6, the eighth FET switch M8 and the ninth FET switch M9 becomes a conducted state as shown in FIG. 8 (shown in a solid line in FIG. 8), and each FET switch of the fourth FET switch M4, the fifth FET switch M5, the seventh FET switch M7 and the tenth FET switch M10 becomes a non-conducted state (shown in a dashed line in FIG. 8).

Therefore, a wire connection 81 is connected to a wire connection 83 and a wire connection 84 is connected to a wire connection 88, and the first storage capacitor Fd1 and the first capacitor C1 equivalently make parallel connection. Similarly, a wire connection 82 is connected to a wire connection 86 and a wire connection 85 is connected to a wire connection 89, and the second storage capacitor Fd2 and the second capacitor C2 equivalently make parallel connection.

Figure 9:
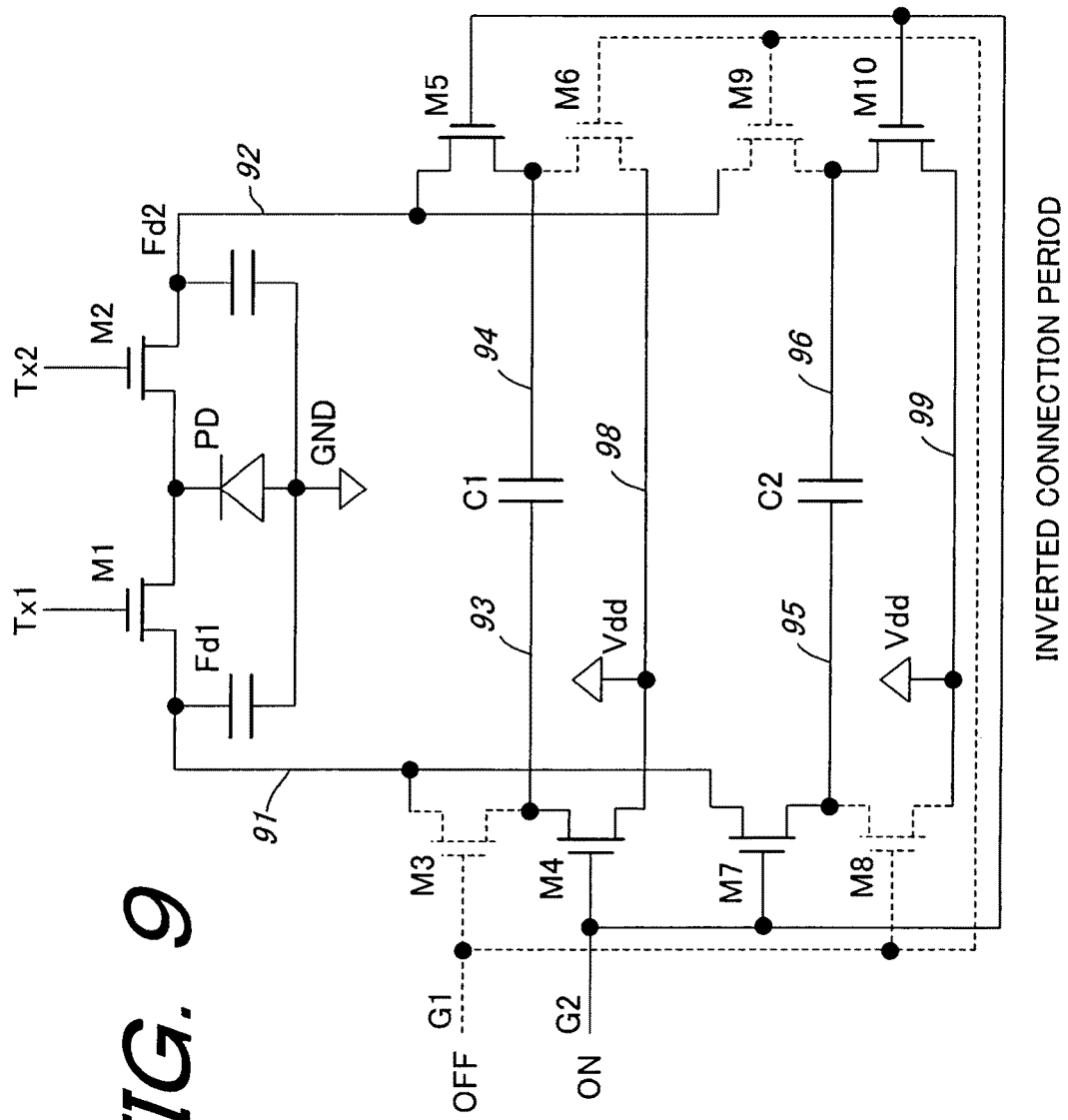
FIG. 9 is a circuit diagram showing the connected state of FET switches in an inverted connection period.

On the other hand, since voltage is applied to the second gate G2 and voltage is not applied to the first gate G1 in the inverted connection period, each FET switch of the third FET switch M3, the sixth FET switch M6, the eighth FET switch M8 and the ninth FET switch M9 becomes a non-conducted state as shown in FIG. 9 (shown by a dashed line in FIG. 9), and each FET switch of the fourth FET switch M4, the fifth FET switch M5, the seventh FET switch M7 and the tenth FET switch M10 becomes a conducted state (shown by a solid line in FIG. 9).

Therefore, a wire connection 91 is connected to a wire connection 95 and a wire connection 96 is connected to a wire connection 99, and the first storage capacitor Fd1 and the second capacitor C2 equivalently make parallel connection. Similarly, a wire connection 92 is connected to a wire connection 94 and a wire connection 93 is connected to a wire connection 98, and the second storage capacitor Fd2 and the first capacitor C1 equivalently make parallel connection.

However, polarity where the first capacitor C1 and the second capacitor C2 are connected to the first storage capacitor Fd1 and the second storage capacitor Fd2 becomes opposite in the normal connection period and the inverted connection period.

Next, description will be made for operation of the solid-state image sensor 100 in the above-described normal connection period and inverted connection period referring to the explanatory view of the principle of operation shown in FIG. 10.

Figure 10:
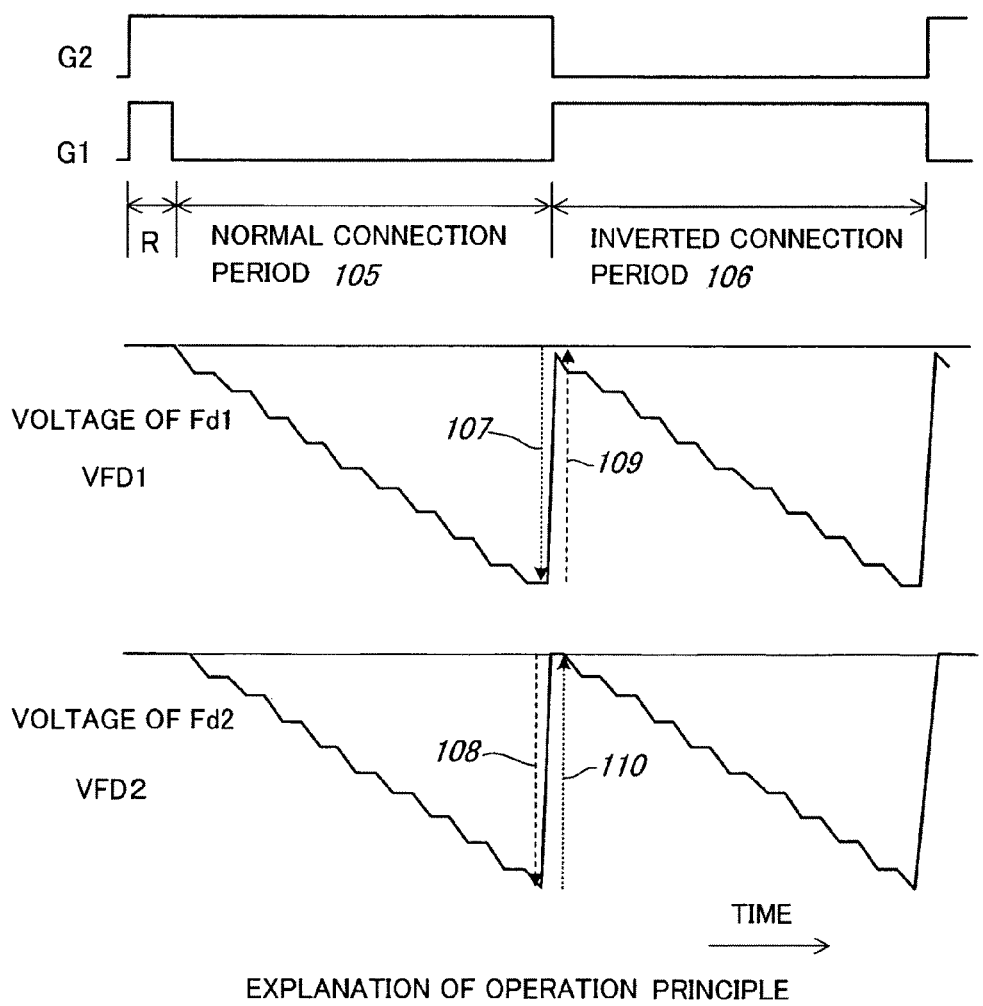
FIG. 10 is an explanatory view of the operation principle of the solid-state image sensor according to the present invention.

FIG. 10 is the timing chart showing the voltage changes of the first gate G1, the second gate G2, the first storage capacitor Fd1 and the second storage capacitor Fd2, and in FIG. 10, time should pass from the left side toward the right side in the drawing. It is to be noted that the voltage of the first storage capacitor Fd1 should be expressed in VFD1 and voltage of the second storage capacitor Fd2 should be expressed in VFD2 in the following explanation.

Herein, in each of the normal connection period and the inverted connection period, photoelectron flown to the first storage capacitor Fd1 and the second storage capacitor Fd2 are also stored in the first capacitor C1 and the second capacitor C2 which are parallelly connected to each of the above-described FET switches.

In short, charge flowing in each period of time of the normal connection period and the inverted connection period is equally divided to the first storage capacitor Fd1 and the first capacitor C1, and to the second storage capacitor Fd2 and the second capacitor C2 respectively when electric capacitance is equal.

Assuming that charge flown to the first storage capacitor Fd1 in the normal connection period be expressed in $\Delta QFD1$ and charge flown to the second storage capacitor Fd2 in the period be expressed in $\Delta QFD2$, the voltage VFD1 of the first storage capacitor Fd1 and the voltage VFD2 of the second storage capacitor Fd2 when the normal connection period ends are respectively expressed as follows.

$VFD1=Vdd-\Delta QFD1/2C$(voltage shown by reference numeral 107 in FIG. 10)

$VFD2=Vdd-\Delta QFD2/2C$(voltage shown by reference numeral 108 in FIG. 10)

When the normal connection period ends and applied pulse to the first gate G1 and the second gate G2 is inverted at the next moment, charge stored in the first capacitor C1 is flown to the second storage capacitor Fd2, and charge stored in the second capacitor C2 is flown to the first storage capacitor Fd1.

At this point, connection polarity between the first capacitor C1 and the second capacitor C2 is opposite, charge is not added but its major part is neutralized.

However, a difference between $\Delta$QFD1 and $\Delta$QFD2 is not neutralized, but charge becomes residual such that it is left on a side having much charge and is excessively subtracted from a side having less charge.

In short, they are expressed as follows.

VFD1=Vdd−($\Delta$QFD1−$\Delta$QFD2)/4C(voltage shown by reference numeral 109 in FIG. 10)

VFD2=Vdd−($\Delta$QFD2−$\Delta$QFD1)/4C(voltage shown by reference numeral 110 in FIG. 10)

As described, only the difference component of inflow charge becomes residual in the first storage capacitor Fd1 and the second storage capacitor Fd2 and in the first capacitor C1 and the second capacitor C2, same components disappear by the neutralization of charge, and it can be read as the voltage of the first storage capacitor Fd1 and the second storage capacitor Fd2.

Figure 11:
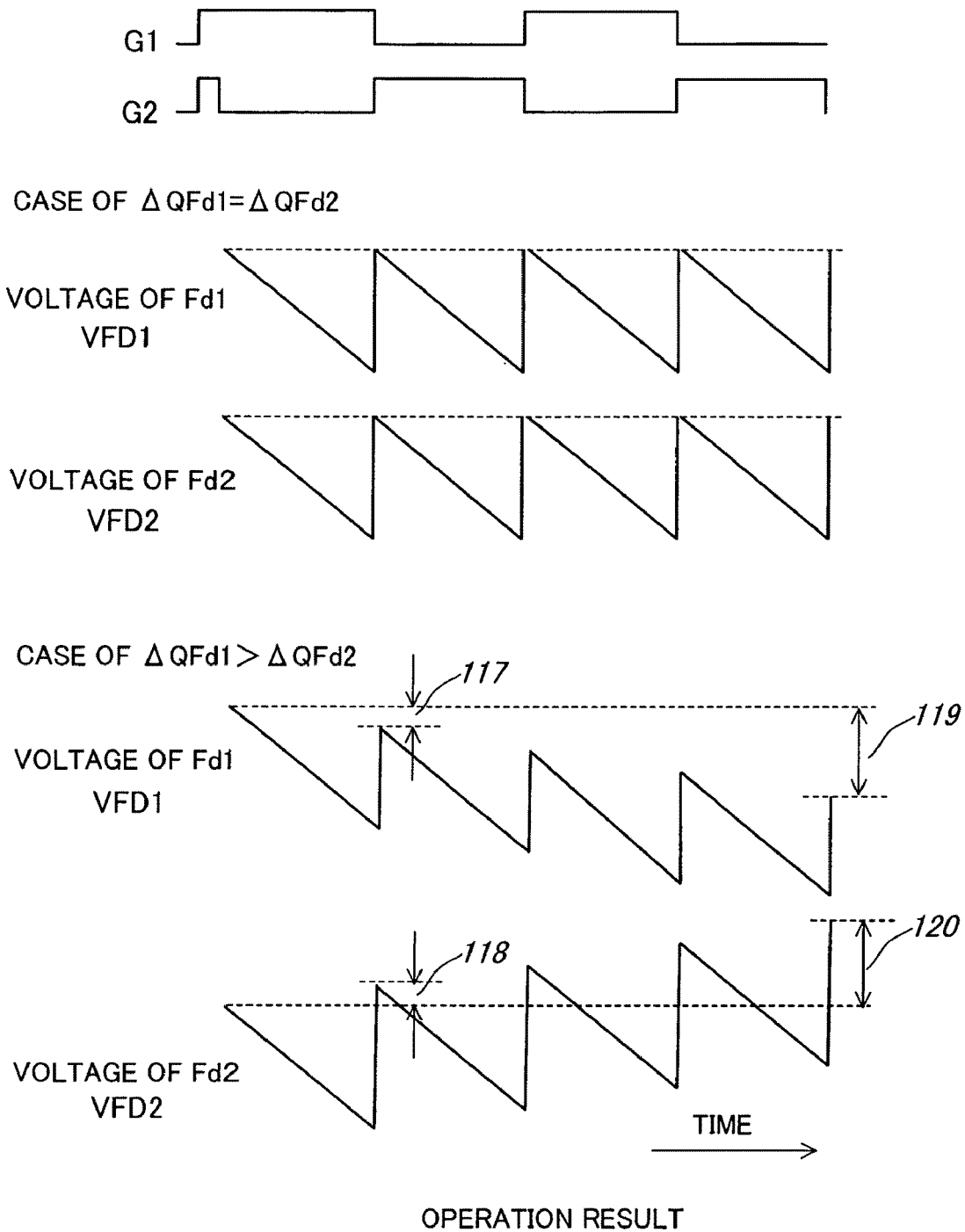
FIG. 11 is an explanatory view of the operation result of the solid-state image sensor according to the present invention, which shows voltage change of the first storage capacitor Fd1 and the second storage capacitor Fd2 by the repetition of the normal connection period and the inverted connection period.

When such the normal connection period and the inverted connection period are repeated, the voltage of the first storage capacitor Fd1 and the second storage capacitor Fd2 changes in an accumulating manner according to residual difference component as shown in FIG. 11 (refer to voltage shown by reference numeral 117, reference numeral 118, reference numeral 119, reference numeral 180).

Herein, when a time integrated value in the given time of $\Delta$QFD1 is expressed in QFD1, and a time integrated value in the given time of $\Delta$QFD2 is expressed in QFD2, the voltage difference between the first storage capacitor Fd1 and the second storage capacitor Fd2 after passing the given time becomes (QFD1−QFD2)/2C, and the total amount of QFD1 and QFD2 is not stored but only a difference amount is stored.

Therefore, in FIG. 1, major part of photoelectrons (noise) caused by the reflection light derived from background light L4, which is derived from the background light L3, is removed by the circuit, only photoelectrons (signal) caused by the reflection light derived from high-frequency-modulated light L2, which is derived from the LED light source 10, being the target information amount is stored.

Specifically, according to the solid-state image sensor 100 of the charge sorting method, which is used in the time-of-flight measurement method, the noise derived from background light by the reflection light from the subject derived from background light can be eliminated, and the reflection light from the subject derived from a predetermined light source, which is previously set in the solid-state image sensor, can be effectively extracted as a signal component to make it possible to achieve high sensitivity and low noise.

Meanwhile, in the above-described embodiment, description has been made for the case where all of electric capacitance values of the first storage capacitor Fd1, the second storage capacitor Fd2, the first capacitor C1 and the second capacitor C2 were equal.

However, practically, it is based on the condition that the first storage capacitor Fd1 and the second storage capacitor Fd2 are substantially equal and the first capacitor C1 and the second capacitor C2 are accurately equal, and the electric capacitance values of the first storage capacitor Fd1 formed by diffusion and the second storage capacitor Fd2 and the electric capacitance value of the first capacitor C1 formed in metal layers and the second capacitor C2 do not need to be matched.

Specifically, the solid-state image sensor 100 sufficiently operates at an accuracy controlled by a standard IC process.

Figure 15:
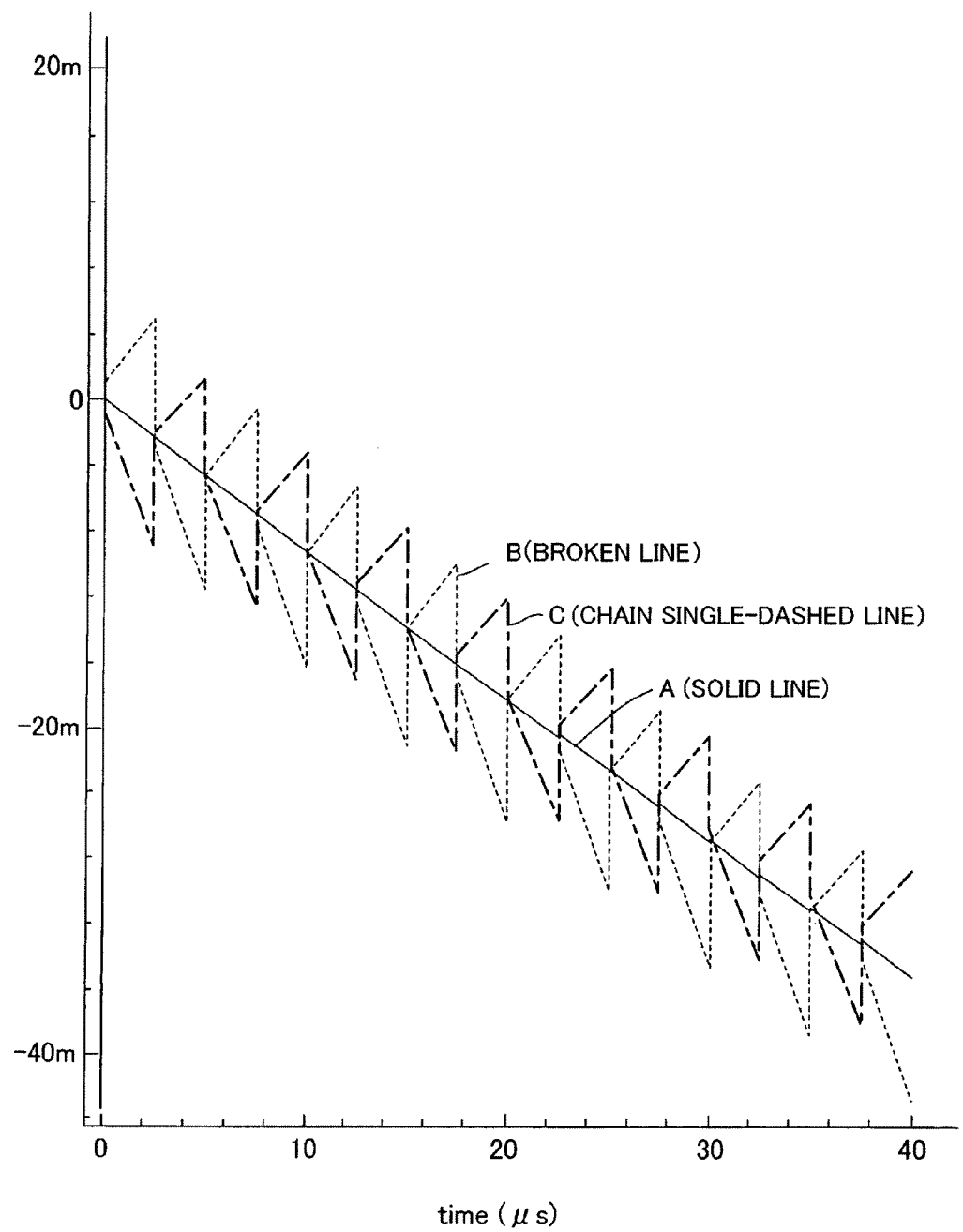
FIG. 15 is a graph expressing the result of Spice simulation in the case where the accuracy of a first capacitor C1 and a second capacitor C2 is inferior.

It is to be noted that, FIG. 15 shows the graph expressing the result of Spice simulation in the case where the accuracy between the first capacitor C1 and the second capacitor C2 is inferior.

In the graph of FIG. 15, time (Time) is taken on the axis of abscissas in the unit of microsecond (is), the difference component of extracted stored charge, that is, the value of result obtained by calculating a difference between the voltage of the first storage capacitor Fd1 and the second storage capacitor Fd2 is taken on the axis of ordinate. It is to be noted that each FET switch is switched at the 5-microsecond period to invert the normal connection period and the inverted connection period.

In FIG. 15, a solid line A shows the simulation result in the case where the electric capacitance values of the first capacitor C1 and the second capacitor C2 are equal, which indicates that the difference component of charge is extracted substantially linearly.

In contrast to the solid line A, a dashed line B shows the simulation result in the case where the first capacitor C1 is fixed and the second capacitor C2 is reduced by 10%, and furthermore, a chain single-dashed line C shows the simulation result in the case where the first capacitor C1 is fixed and the second capacitor C2 is increased by 10%.

Herein, since voltage conversion of stored charge is proportional to capacitor accuracy deterioration of capacitor causes a large error, and the solid line A, the dashed line B and the chain single-dashed line C diverge from each other.

However, since the first capacitor C1 and the second capacitor C2 are switched by each FET switch and connected to the both of the first storage capacitor Fd1 and the second storage capacitor Fd2 as described above, the error works in an off-set direction by the switching at the 5 microsecond period, for example, and is brought back to a normal value.

As a result, accumulating error is only 5% of the difference amount and capacitor accuracy in an actual semiconductor process is 2 to 3%, so that the value falls into an error practically having no problem at all.

Further, since parasitic junction capacitance in the third to tenth FET switches (M3 to 10) causes switching loss, it is necessary to make the third to tenth FET switches (M3 to 10) be smaller aiming at the reduction of the junction capacitance in actual design.

At the same time, a circuit having smaller loss can be constituted by using the first capacitor C1 and the second capacitor C2 having appropriate capacitance values.

Meanwhile, in the above-described solid-state image sensor 100, a semiconductor impurity region used in the first storage capacitor Fd1, the second storage capacitor Fd2 or the first to tenth FET switches (M1 to 10) can be constituted either by a P-type or an N-type.

For example, in the case of constituting the above-described semiconductor impurity region by the N-type, the first storage capacitor Fd1, the second storage capacitor Fd2 and the first to tenth FET switches (M1 to 10) are formed in an N region formed on a P substrate, pulse having appropriate voltage where a threshold voltage amount is added to the power source voltage Vdd is applied to each gate.

Further, in the case where the first FET switch M1 and the second FET switch M2 are constituted by an N-type FET, the third to tenth FET switches (M3 to 10) are constituted by a P-type FET, backgate voltage (voltage in an N⁻region which is not shown in the circuit diagram) is made higher than the power source voltage Vdd to be applied to the extent where forward direction current is not flown by a PN junction. For example, backgate voltage is set to 2.5V when the power source voltage Vdd is 1.8V. In such a case, applied voltage to each gate of the third to tenth FET switches (M3 to 10) should be backgate voltage and GND potential.

Further, although constitutions other than the above-described one is possible, it is desirable to constitute a circuit while taking into consideration that either the first capacitor C1 or the second capacitor C2 is charged faster than the power source voltage Vdd to reach high voltage.

Specifically, since noise based on the quantum nature of light (called as photon shot noise) generally increases by the square root of exposed light quantity and a signal component increases in proportion, exposure light quantity increases as exposure time is extended and the signal-to-noise ratio improves.

According to the present invention, even in the case where a trace of the reflection light derived from high-frequency-modulated light L2, which is derived from the LED light source 10, is buried in a large quantity of the reflection light derived from background light L4, which is derived from the background light L3, the background light L4 is removed to prevent it from being saturated in the imaging for along exposure time, so that the signal-to-noise ratio improves.

However, since the switching noise of the third to tenth FET switches (M3 to 10) (called as kCT noise) is generated every time when inverting operation is repeated, there is a fear that the signal-to-noise ratio could be deteriorated if excessive inverting operation is performed. If the number of photons in incoming reflection light derived from background light L4, which is derived from the background light L3, in a unit time is equivalent to 1 million electrons, the photon shot noise is approximately 1000 electrons.

Further, assuming the storage capacitor be 0.05 pF, the kCT noise by one time switching is approximately 50 electrons, the kCT noise generated by inverting operation repetition of about 100 times per unit time is approximately 500 electrons by square root addition. Therefore, since the photon shot noise is superior, adverse effect by switching is small. However, in 1000 times of repetition, the kCT noise equivalent to 1500 electrons is generated to cause adverse effect. Taking this into consideration, it is preferable to set the background light quantity and storage capacitor, and the number of inverting operation of the normal connection period and the inverted connection period per unit time to optimum values.

Incidentally, in the actual time-of-flight measurement method, it is impossible to know a term by the attenuation of light caused by the reflectivity of a subject and distance from a light source only by the difference signal between the two storage capacitors of the first storage capacitor Fd1 and the second storage capacitor Fd2.

Herein, assuming that a signal to be obtained be S, a phase angle be d, and an unknown term be intensity coefficient X, their relationship can be approximated as follows.

$$S = X \cdot \sin(d) \quad (1)$$

Note that 0<d<360 degrees should be satisfied.

Since X is a positive value in the above-described Expression (1), it is possible to know whether d is no more than or no less than 180 degrees from whether S is positive or negative. However, it is impossible to know the accurate value of d.

Figure 12:
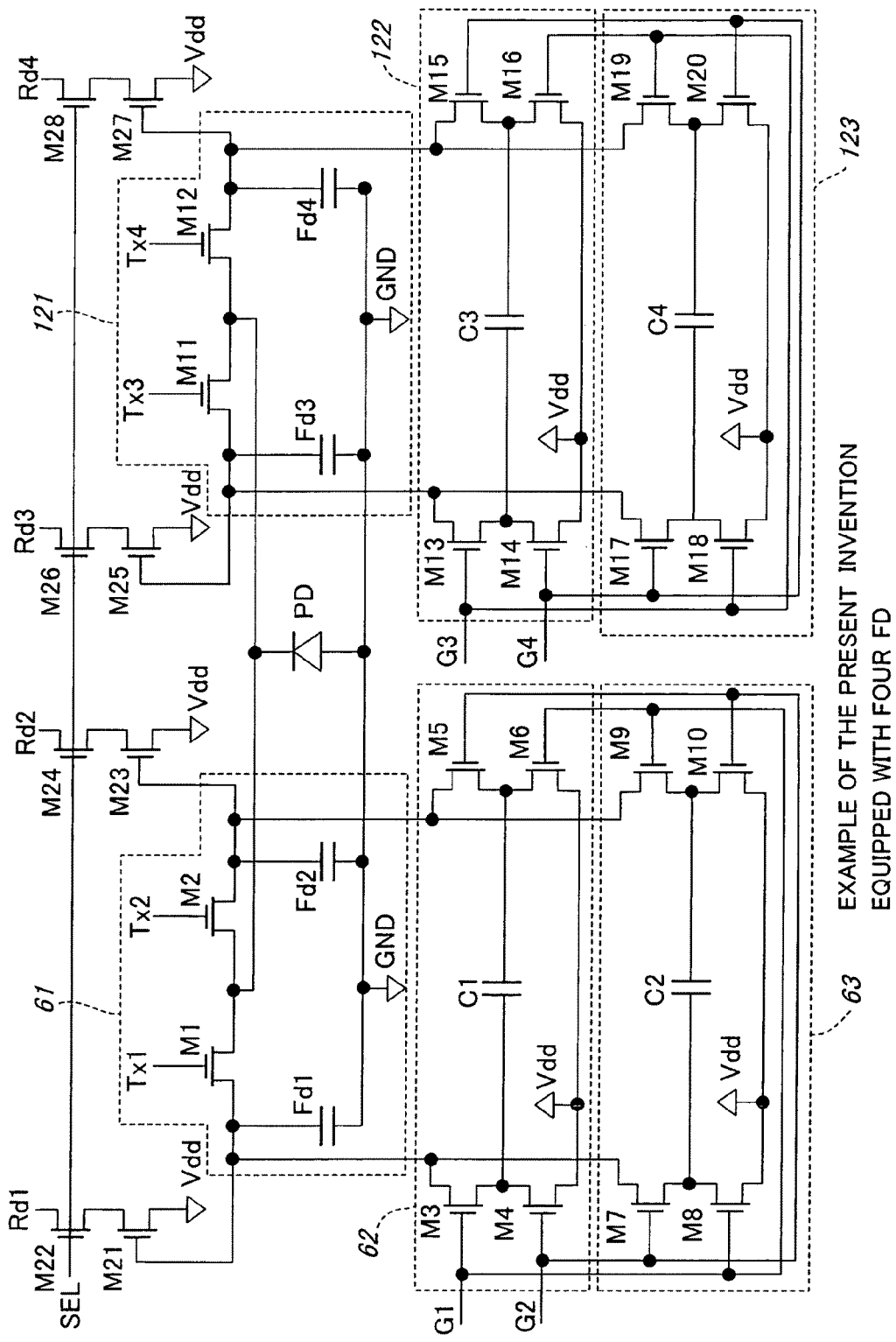
FIG. 12 is a circuit diagram of another embodiment example of the solid-state image sensor according to the present invention that is constituted by having four storage capacitors and four capacitor connection control sections.

Therefore, to know the accurate value of d, the solid-state image sensor 100 including the circuit (difference extraction circuit), which has the separating/storing section 61 provided with two storage capacitors for extracting the difference, the first capacitor connection control section 62 and the second capacitor connection control section 63 explained in FIG. 6, is expanded substantially by twice, and the circuit by another embodiment of the present invention, which is constituted by having four storage capacitors and four capacitor connection control sections shown in FIG. 12, is constituted.

In FIG. 12, the circuit constituent portion constituted by the first to tenth FET switches (M1 to 10) is equal to FIG. 6, and the circuit constituent portion constituted by the 11th to 20th FET switches (M1 to 20) constituted by totally the same structure as the first to tenth FET switches (M1 to 10) respectively is a circuit portion newly added to the circuit shown in FIG. 6.

Herein, the 21st to 28th FET switches (M21 to 28) are signal readout circuits, the 21st FET switch M21, the 23rd FET switch M23, the 25th FET switch M25 and the 27th FET switch M27 are buffer amplifiers that detect the potential of the first storage capacitor Fd1, the second storage capacitor Fd2, the third storage capacitor Fd3 and the fourth storage capacitor Fd4, the 22nd FET switch M22, the 24th FET switch M24, the 26th FET switch M26 and the 28th FET switch M28 are switches controlled by line selection wire (SEL).

Figure 13:
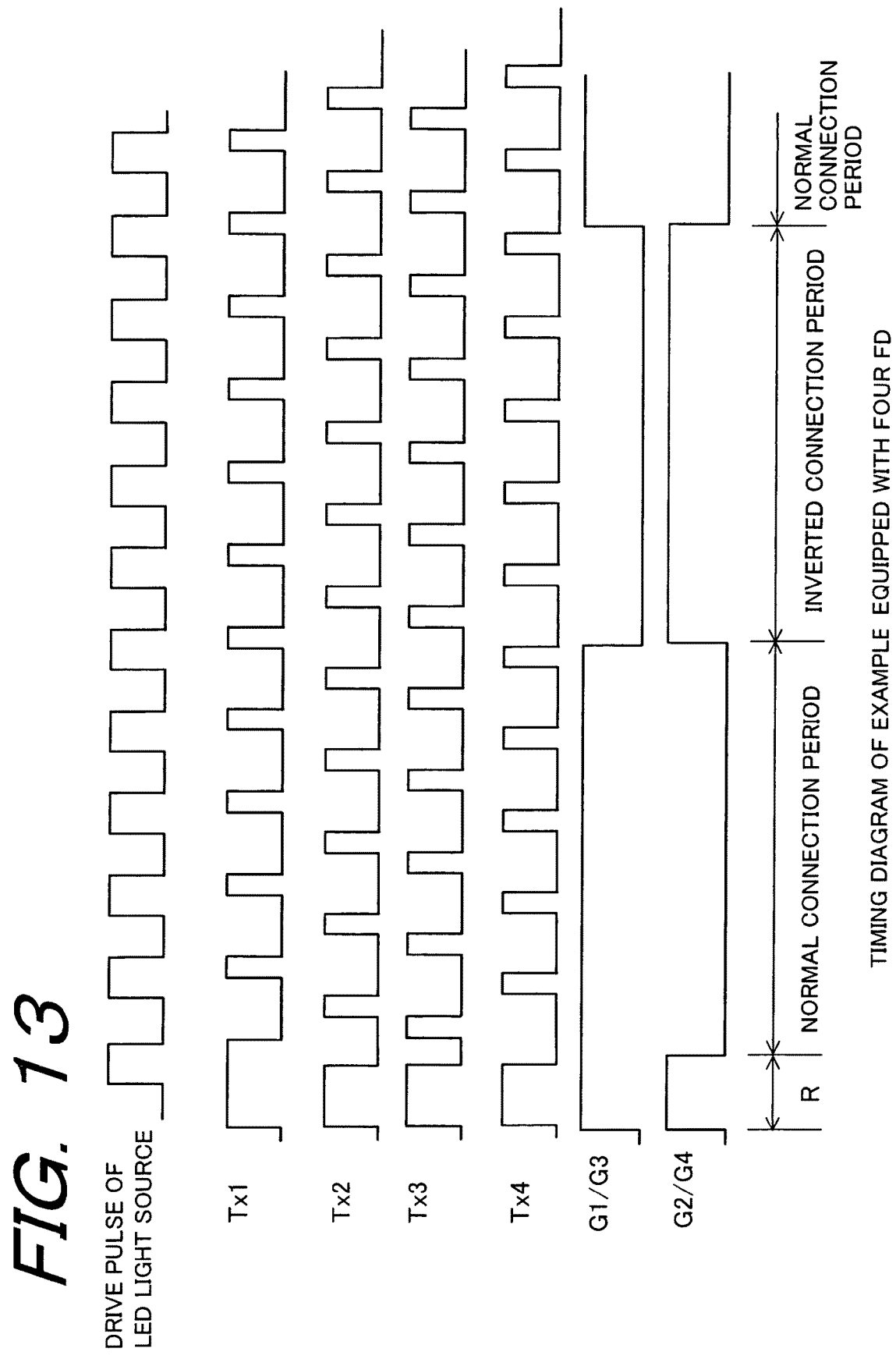
FIG. 13 is a timing diagram of the solid-state image sensor according to the present invention that is constituted by having four storage capacitors and four capacitor connection control sections, which shows the timing chart of gate voltage applied to the circuit of the solid-state image sensor according to the present invention constituted by having four storage capacitors and four capacitor connection control sections.

Such a circuit shown in FIG. 12 drives each gate wire according to the timing chart shown in FIG. 13.

In the circuit shown in FIG. 12, since storage capacitors sorting charge are four of the first storage capacitor Fd1, the second storage capacitor Fd2, the third storage capacitor Fd3 and the fourth storage capacitor Fd4, the component of the reflection light derived from high-frequency-modulated light L2 at each phase angle of 0 degree, 90 degrees, 180 degrees and 270 degrees can be separated and stored.

Then, in the circuit shown in FIG. 12, the separating/storing section 61 corresponding to 0 degree and 180 degrees, that is, the first transfer gate Tx1 and the second transfer gate Tx2, the first capacitor connection control section 62 and the second capacitor connection control section 63 constitute a circuit corresponding to the circuit shown in FIG. 6, and furthermore, a separating/storing section 121 corresponding to 90 degrees and 270 degrees, that is, the third transfer gate Tx3 and the fourth transfer gate Tx4 (equivalent to the separating/storing section 61), a first capacitor connection control section 122 (equivalent to the first capacitor connection control section 62) and a second capacitor connection control section 123 (equivalent to the second capacitor connection control section 63) constitute a circuit corresponding to the circuit shown in FIG. 6.

Specifically, according to the circuit shown in FIG. 12, two sets of circuits equivalent to the circuit shown in FIG. 6 are severally constituted independently, and at this point, when drive pulse to be applied is devised, the same pulse can be used for the first gate G1 driving the first capacitor connection control section 62 and the second capacitor connection control section 63, a third gate G3 driving the first capacitor connection control section 122 and the second capacitor connection control section 123, the second gate G2 driving the first capacitor connection control section 62 and the second capacitor connection control section 63 and a fourth gate G4 driving the first capacitor connection control section 122 and the second capacitor connection control section 123.

Specifically, the device is that, as shown in FIG. 13, pulse to the transfer gates of the first to fourth transfer gates (Tx1 to 4) is set to pulse having the duty ratio 1:3, it is generated at the timing of 0 degree, 90 degrees, 180 degrees and 270 degrees to the drive pulse of the LED light source 10, and the switching timing of the first gate G1 and the second gate G2 is set such that the same numbers of each pulse of the first to fourth transfer gates (Tx1 to 4) are included.

Further, reset pulse is ended at the 0 degree transfer gate signal, that is, immediately before the effective phase of the first transfer gate Tx1 in FIG. 13.

As a result, two pieces of information which are a difference signal corresponding to a difference between 0 degree and 180 degrees and a difference signal corresponding to a difference between 90 degrees and 270 degrees can be obtained. Since the term of the attenuation of light caused by the. reflectivity of a subject and distance from a light source equally affects the both difference signals, the both may be the same value X. Assuming that a newly added signal be C, approximation can be as follows.

$$S = X \cdot \sin(d) \quad \text{Expression (2)}$$

$$C = X \cdot \cos(d) \quad \text{Expression (3)}$$

Note that 0<d<360 degrees should be satisfied.

From the two measured values of S and C, the two expressions of the above-described Expression (2) and Expression (3) can be solved and X and d can be determined uniquely.

Figure 14:
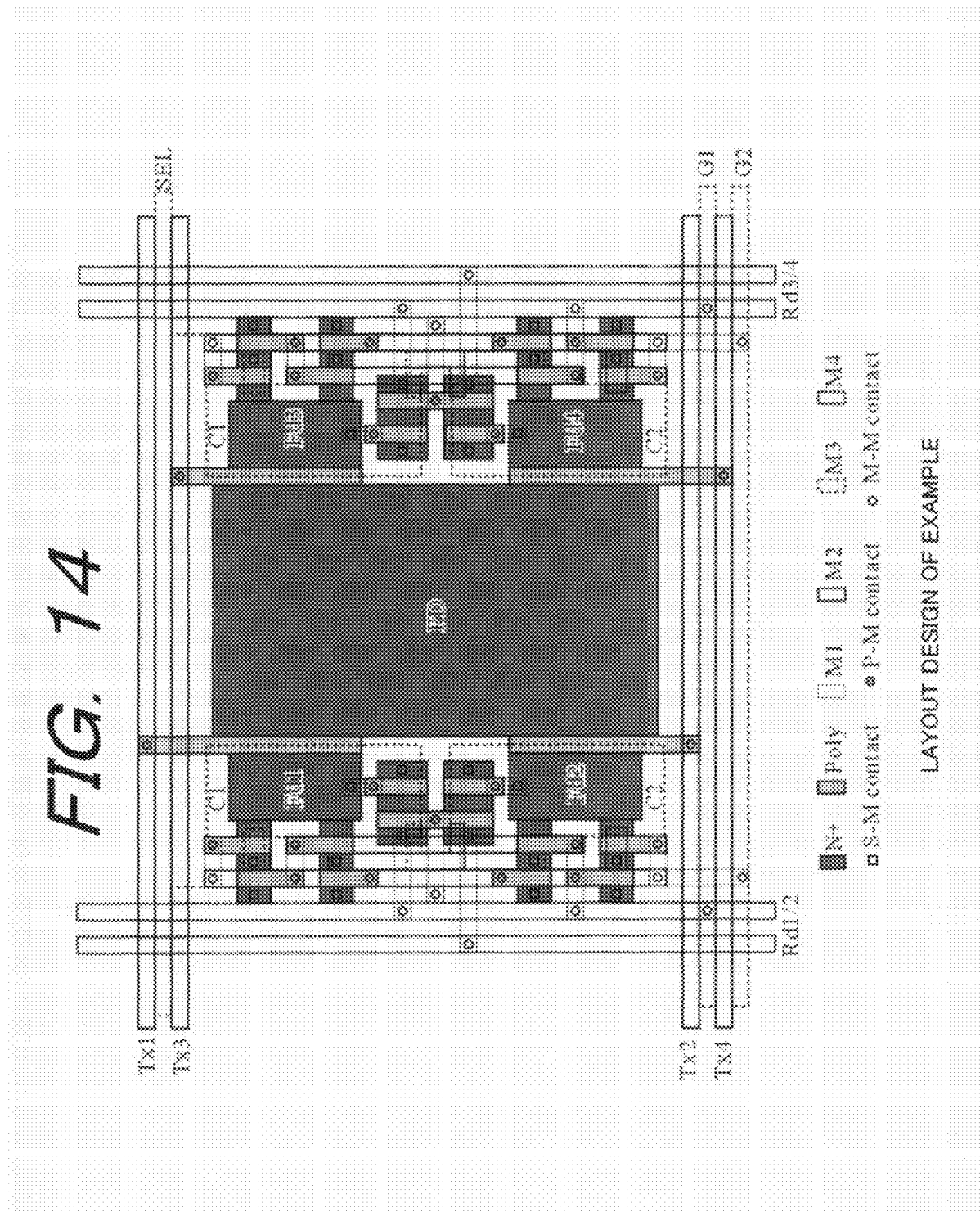
FIG. 14 is an example of a layout view where the circuit of the solid-state image sensor according to the present invention constituted by having four storage capacitors and four capacitor connection control sections is laid out on an IC.

It is to be noted that FIG. 14 shows an example of the layout view where the circuit shown in FIG. 12 is laid out on an IC.

Specifically, it can be confirmed that the circuit shown in FIG. 12 can be smoothly arranged and wired in a general CMOS process using 1 layer polysilicon wiring (P1) and 5 layers of metal wirings (M1 to M5). Therefore, the present invention can be implemented.

Further, the waveform of each gate wire shown in FIG. 13 is an example, arbitrary combinations of the relationship between the phase angle of light emission pulse and each Tx wire of the first to fourth transfer gates (Tx1 to 4) are possible. Similarly, opening of one or two transfer gates immediately before the light emission of the LED light source 10 and allocating the remaining gates after the light emission are also possible.

Further, two storage capacitors were used in the circuit shown in FIG. 6 and four storage capacitors were used in the circuit shown in FIG. 12, but the number of storage capacitors is not limited to this but the number of storage capacitors can be a plural arbitrary number. Specifically, two or more storage capacitors may be used in the circuit shown in FIG. 6, and four or more storage capacitors may be used in the circuit shown in FIG. 12.

Moreover, in the above-described embodiments of the present invention, description has been made for the case where the constitution shown in FIG. 3 were applied as the constitution of the light-receiving portion separating and storing charge, it goes without saying that the invention is not limited to this.

Specifically, a constitution different from the constitution shown in FIG. 3 may be applied as long as it includes a plurality of charge-storage sections and is capable of discriminating photoelectrons generated in incoming light on the incoming timing and sorting to the plurality of charge-storage sections.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

The entire disclosure of Japanese Patent Application No. 2006-268324 filed on Sep. 29, 2006 including specification, claims, drawings and summary are incorporated herein by reference in its entirety.

What is claimed is:

1. A solid-state image sensor that is equipped with a plurality of charge-storage sections, discriminates photoelectrons generated by incoming light on the incoming timing and sort to said plurality of charge-storage sections, and measures the timing of the incoming light, said sensor comprising:
   a plurality of capacitors capable of conducting to the plurality of charge-storage sections; and
   a control section that controls a conducted state between said plurality of charge-storage sections and said plurality of capacitors, wherein
   by selectively conducting said plurality of charge-storage sections and said plurality of capacitors by the control of said control section, the difference component of charge stored in said plurality of charge-storage sections is extracted.

2. The solid-state image sensor according to claim 1, wherein
   the electric capacitance values of said plurality of capacitors are equal to each other, and
   the sensor is equipped with connection switching circuits, each of which is constituted by two FET switches, on the both terminals of said plurality of capacitors as said control section.

3. The solid-state image sensor according to claim 2, wherein
   one terminal of said FET switch is connected to said plurality of charge-storage sections and the other terminal of said FET switch is connected to bias voltage.

4. The solid-state image sensor according to claim 1, wherein
   said plurality of charge-storage sections are made up of two charge-storage sections,
   said plurality of capacitors are made up of two capacitors, and
   said control section repeats a first connected state where one side of said charge-storage section is connected to one side of said capacitor and the other side of said charge-storage section is connected to the other side of said capacitor and a second connected state where the other side of said charge-storage section is connected to one side of said capacitor and one side of said charge-storage section is connected to the other side of said capacitor, by each given amount of time.

5. The solid-state image sensor according to claim 2, wherein
   said plurality of charge-storage sections are made up of two charge-storage sections,
   said plurality of capacitors are made up of two capacitors, and
   said control section repeats a first connected state where one side of said charge-storage section is connected to one side of said capacitor and the other side of said charge-storage section is connected to the other side of said capacitor and a second connected state where the other side of said charge-storage section is connected to one side of said capacitor and one side of said charge-storage section is connected to the other side of said capacitor, by each given amount of time.

6. The solid-state image sensor according to claim 3, wherein
   said plurality of charge-storage sections are made up of two charge-storage sections,
   said plurality of capacitors are made up of two capacitors, and
   said control section repeats a first connected state where one side of said charge-storage section is connected to one side of said capacitor and the other side of said charge-storage section is connected to the other side of said capacitor and a second connected state where the other side of said charge-storage section is connected to one side of said capacitor and one side of said charge-storage section is connected to the other side of said capacitor, by each given amount of time.

* * * * *